(12) United States Patent
Hsuan

(10) Patent No.: US 6,822,316 B1
(45) Date of Patent: Nov. 23, 2004

(54) INTEGRATED CIRCUIT WITH IMPROVED INTERCONNECT STRUCTURE AND PROCESS FOR MAKING SAME

(75) Inventor: John Min-Chih Hsuan, Hsin Chu (TW)

(73) Assignee: United Microelectronics Corp., Hsin Chu (TW)

( * ) Notice: Subject to any disclaimer, the term of this patent is extended or adjusted under 35 U.S.C. 154(b) by 0 days.

(21) Appl. No.: 10/167,118

(22) Filed: Jun. 11, 2002

Related U.S. Application Data (63) Continuation of application No. 09/304,244, filed on May 3, 1999, now Pat. No. 6,429,509.

(51) Int. Cl.[7] ............................................. H01L 29/40
(52) U.S. Cl. ..................................... 257/621; 774/776
(58) Field of Search ................... 257/621, 690, 257/699, 700, 708, 774, 776, 778, 618, 777

(56) References Cited

U.S. PATENT DOCUMENTS

| | | | |
|---|---|---|---|
| 3,636,619 A | | 1/1972 | Welty et al. |
| 3,962,052 A | | 6/1976 | Abbas et al. |
| 4,348,253 A | | 9/1982 | Subbarao et al. |
| 4,416,054 A | | 11/1983 | Thomas et al. |
| 4,419,182 A | * | 12/1983 | Westerberg .................. 216/26 |
| 4,808,273 A | | 2/1989 | Hua et al. |
| 4,930,216 A | | 6/1990 | Nelson |
| 4,954,875 A | * | 9/1990 | Clements .................... 257/686 |
| 4,978,639 A | | 12/1990 | Hua et al. |
| 4,984,358 A | | 1/1991 | Nelson |
| 5,037,782 A | | 8/1991 | Nakamura et al. |
| 5,148,265 A | | 9/1992 | Khandros et al. |
| 5,148,266 A | | 9/1992 | Khandros et al. |
| 5,229,647 A | | 7/1993 | Gnadinger |
| 5,252,842 A | | 10/1993 | Buck et al. |
| 5,258,330 A | | 11/1993 | Khandros et al. |
| 5,284,796 A | | 2/1994 | Nakanishi et al. |
| 5,313,366 A | | 5/1994 | Gaudenzi |
| 5,424,245 A | | 6/1995 | Gultler et al. |
| 5,426,072 A | * | 6/1995 | Finnila ........................ 438/107 |
| 5,532,612 A | | 7/1996 | Liang |
| 5,548,091 A | | 8/1996 | Distefano et al. |
| 5,578,526 A | | 11/1996 | Akram et al. |
| 5,599,744 A | * | 2/1997 | Koh et al. ................... 438/660 |
| 5,661,087 A | | 8/1997 | Pedersen et al. |
| 5,682,062 A | | 10/1997 | Gaul |
| 5,861,662 A | | 1/1999 | Candelore |
| 5,898,215 A | | 4/1999 | Miller et al. |
| 5,952,712 A | | 9/1999 | Ikuina et al. |
| 5,986,339 A | | 11/1999 | Pai et al. |
| 6,005,292 A | | 12/1999 | Roldan et al. |
| 6,168,969 B1 | | 1/2001 | Farnworth |
| 6,400,172 B1 | * | 6/2002 | Akram et al. ................ 324/765 |

* cited by examiner

*Primary Examiner*—Minhloan Tran
*Assistant Examiner*—Leonardo Anújar
(74) *Attorney, Agent, or Firm*—J. Nicholas Gross

(57) ABSTRACT

A semiconductor die and an associated low resistance interconnect located primarily on the bottom surface of such die is disclosed. This arrangement provides a flexible packaging structure permitting easy interconnected with other integrated circuits; in this manner, a number of such circuits can be stacked to create high circuit density multi-chip modules. A process for making the device is further disclosed. To preserve structural integrity of a wafer containing such die during manufacturing, a through-hole via formed as part of the interconnect is filled with an inert material during operations associated with subsequent active device formation on such die.

18 Claims, 8 Drawing Sheets

INTEGRATED CIRCUIT WITH IMPROVED INTERCONNECT STRUCTURE AND PROCESS FOR MAKING SAME

CROSS REFERENCE TO RELATED APPLICATIONS

The present application is a continuation of Ser. No. 09/304,244 filed May 3, 1999, now U.S. Pat. No. 6,429,509 which is hereby incorporated by reference herein.

FIELD OF THE INVENTION

The invention relates generally to the area of semiconductor device interconnects and packaging techniques. More particularly, the invention discloses an integrated circuit die that is formed with controllable sized and spaced throughholes extending through a substrate of such die, so that such die can be easily and optimally interconnected and packaged.

BACKGROUND OF THE INVENTION

Contemporary integrated circuits (ICs) include collections of interconnected electronic circuits embodied in semiconductor structures formed during processing of a silicon substrate wafer. The formation of a particular IC can require several hundred discrete complex processing steps within a fab, and is carefully controlled and monitored to ensure a high yield of good die for any particular wafer being processed. With all other things being equal, from a device performance perspective, interconnections between distinct logical circuit areas should be as short as possible. In this way, such characteristics as yield, device density, device speed, capacitive delays, power dissipation, signal attenuation, to name a few, are all enhanced. One way to reduce interconnect distance, of course, is to simply create all the logical circuit areas from the same silicon wafer. This approach, however, suffers from extremely high processing costs, and very poor yield. This is because it is fairly well known in the industry that the expected yield of an individual die during any process is inversely proportional to the physical area occupied by such die. Thus, with all things being equal, from a processing perspective, it is much more preferable to have smaller die embodying smaller blocks of logical circuits. This manufacturing reality operates in direct opposition to the general device performance rule mentioned earlier, and each manufacturer typically engineers a a suitable cost/performance compromise for the part in question.

Regardless of the resulting size of the die, or how many circuits are actually embodied in the final die, it is still necessary to communicate with other circuits outside the distinct silicon area embodying such IC. To do this, some type of interconnect is formed which electrically couples signals directly from the IC and transmits them to the outside world (and vice-versa). Interconnects come in many different shapes and sizes, varying from wire bonding, tape automated bonding (TAB) and controlled collapse chip connection (C4). A variety of packagings for encapsulating die and interconnects are also known in the art, such as DIP, CERDIP, SO, SOP, TSOP, PQFP, LDCC, PLCC, CLCC, PPGA, CPGA, BGA and SBA to name a few.

Again, however, with all things being equal, an interconnect/packaging combination that is minimal in size is preferred, and that is why so-called chip scale varieties, including "flip chip" types are becoming increasingly popular. Flip chip packaging is well-known in the art, and is described at length in a textbook by John H. Lau entitled "Flip Chip Technologies" (McGraw-Hill 1995). Examples of such types of packaging can also be found in U.S. Patent literature, including in U.S. Pat. Nos. 4,930,216 and 4,984,358, which are incorporated by reference herein.

One advantage of this type of packaging is the fact that multiple chips can be assembled in a "stack" fashion, which results in a higher density of circuits, and improved performance because of the short interconnects. Processes for forming the solder bumps on the bottom of a chip scale package for interconnecting other packages are also wellknown. One example is further described in a textbook titled "Semiconductor Packaging—A Multi-disciplinary Approach" by Hanneman et al., at pp. 391–395, and such description is hereby incorporated by reference. Other techniques for creating high density circuits include attempts to interconnect entire wafers to other wafers in a stack fashion, as illustrated generally in U.S. Pat. No. 5,229,647.

Figure 1:
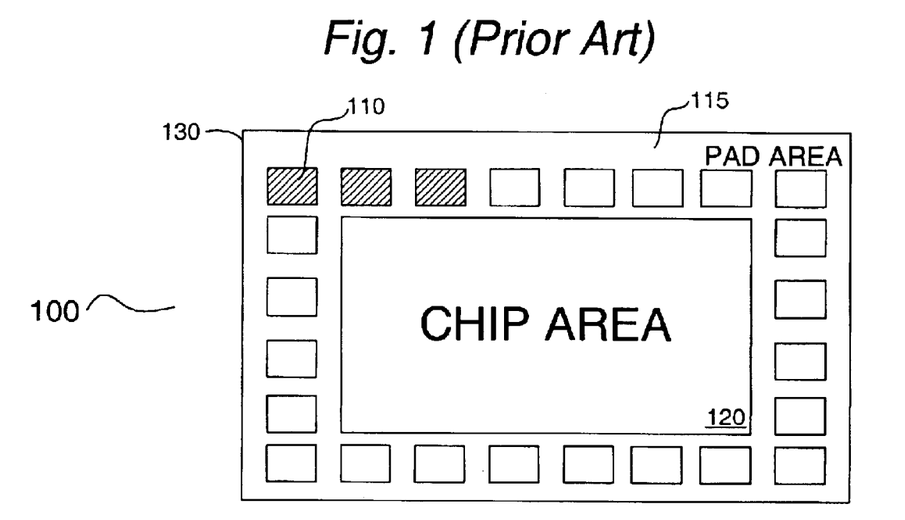
FIG. 1 is a top view of a typical prior art chip scale package.

A typical flip chip type package 100 known in the art is depicted in FIG. 1. It can be seen here that chip package 100 includes a number of bonding pads 110, which are located in a pad area 115 surrounding die (chip) area 120. A total area 130 for package 100 can be seen to be comprised of two distinct sub-areas, therefore, including bonding pad area 115, and die area 120. Again, for a whole number of reasons, including throughput, productivity, cost, and performance considerations, the size of bonding pads 110, and thus area 115, should be kept small compared to the area of chip area 120. However, there is a limit to how small this area can become using conventional processes, because the pads have to be large enough to accommodate a wire bond, or a flip chip type solder bump. Thus, there is inevitably a large amount of surface area, otherwise usable for forming electronic circuits, that is wasted in a chip scale type package as shown in FIG. 1.

Another well-known technique in the art for increasing circuit density within a chip is accomplished by forming holes and/or vias in the substrate of the chip. U.S. Pat. No. 3,962,052 discloses how such holes can created with increased precision by masking both the front and back of the substrate, and doping the exposed areas. In this manner, an etching step can create holes with nearly vertical sidewalls. U.S. Pat. No. 4,348,253 explains that, to avoid the additional registration problem associated with masking both sides of the wafer, a laser hole can be used to create such via holes. The vias, appear to be limited to connecting any circuits to a groundplane, however (as evidenced by the single metallization layer shown at the backside of the substrate) and not for connecting such circuits to another circuit (or set of circuits). In U.S. Pat. No. 4,808,273 additional details are provided for an improved process of electroplating the resulting vias in such substrates. In this reference, the various active elements, bonding pads and metal interconnects are first formed, and then holes are made through the bottom of the substrate to contact the metal bonding pads. It is apparent that this approach, too, is commercially impractical for conventional processing because the fabricating steps are complicated. Another approach for creating via holes in a substrate using a so-called "back-lapping" technique is discussed in U.S. Pat. No. 4,978,639. In this approach, apertures are opened in desired areas of the substrate, using reactive ion etching, but they do not extend all the way through the wafer. A later grinding step is then used to remove enough of the backside of wafer to expose the apertures, creating the vias. Since the masking, etch steps all take place on the front of the wafer, this avoids the backside registration problem. The backside is then completely metallized, and thereafter this layer serves to bridge and form a large ground plane between components within the chip. A similar grinding process is disclosed in U.S. Pat. No. 5,037,782 for the same purpose.

An example of a "stacked" circuit structure using plated holes is illustrated in U.S. Pat. No. 5,682,062. By placing vias in areas where traditional bond pads are found, a number of chips can be stacked on top of each other in a dense form factor.

The aforementioned U.S. patent references, including those describing the various methods that can be used for creating, shaping, and filling holes and vias in substrates, are hereby incorporated by reference. None of the above references, nonetheless, appear to address the problem of how to optimize the usable chip surface area, or how to minimize interconnect areas required to contact other chips. While certain patents issued to Tessera, Inc. are directed generally to this problem (see e.g., U.S. Pat. Nos. 5,148,265; 5,148,266; 5,258,330; and 5,548,091—all of which are hereby incorporated by reference) the solution they proposed involves what is conventionally known as an "interposer," and the manufacturing operations required to implement this flexible intervening layer (between surface contacts and a ball grid array) are extremely complex.

It is apparent that as chip die sizes become smaller, the design of interconnect areas, including pad shape, size, and placement will become more and more critical, and, at one point, will probably be the limiting factor in chip scale packaging. Thus, this problem needs to be solved in a cost effective manner.

A related problem in semiconductor manufacturing is the fact that at least some portion of the interconnect/packaging operations take place within the main fabrication facility, and this is non-optimal for a number of reasons. First, it is not cost effective, because in general fab space is extremely limited, and equipment, labor and overhead costs are quite high in that environment. Second, if packaging/interconnect processing steps are set up as part of the normal manufacturing cycle within the fab, they can impact wafer throughput (cycle time) considerably, because they are typically slow operations. Thus, it would be much more desirable to perform only those absolutely necessary critical operations within the special environment provided within the fab. Similarly, if packaging operations could somehow be accomplished before normal wafer processing operations were undertaken, this would also reduce cycle time significantly. In fact, if this were possible, a wafer fab facility could be operated with more efficiency, lower cost, and higher throughput.

SUMMARY OF THE INVENTION

An object of the present invention, therefore, is to provide a semiconductor integrated circuit having an improved interconnect which minimizes I/O signal attenuation, inductance, and capacitance;

A further object of the present invention, therefore, is to provide a semiconductor integrated circuit having an improved interconnect which is faster, denser, and more reliably manufactured and operated than prior art interconnects;

Yet another object of the present invention, therefore, is to provide a semiconductor integrated circuit having an improved interconnect which provides better power distribution and power dissipation than prior art techniques;

Another object of the present invention, is to provide a semiconductor integrated circuit having an improved interconnect structure which can be controllably configured and optimized so as to maximize a useful processing area within a semiconductor wafer;

A related object of the present invention is to provide an extremely dense electronic circuit comprised of one or more vertically stacked and interconnected ICs of the aforementioned type;

Yet another object is to provide a method of manufacturing the aforementioned novel IC and stacked combinations thereof.

Another object of the present invention is to provide an interconnect/packaging structure and method that is simple, cost-effective, fast, and that does not require the critical resources of a conventional semiconductor fab to perform;

A related object is to provide an interconnect and packaging method that can be can be completed before normal wafer processing operations were undertaken to reduce wafer cycle time.

Although the inventions are described below in a preferred embodiment, it will be apparent to those skilled in the art the present invention would be beneficially used in many environments where it is necessary to provide dense I/O interconnect structures, or where it is advantageous to reduce cycle time by providing chip scale packaging to a die even before normal processing operations are begun.

DETAILED DESCRIPTION OF THE INVENTION

Figure 2A:
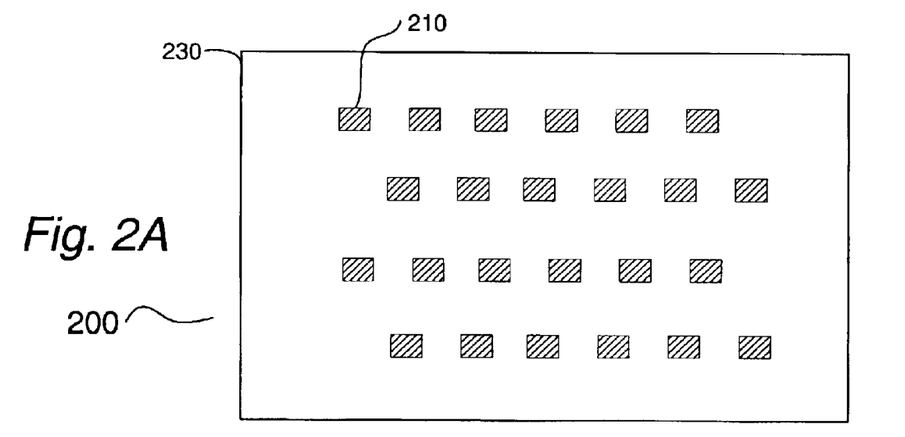
FIGS. 2A–2E are various perspective and cut-away views of various embodiments of a chip package of the present invention.

A top view of an integrated circuit (IC) 200 formed in accordance with the present invention is depicted generally in FIG. 2A. Such circuit 200 includes a die 230, which is formed along with a plurality of other die (not shown) using conventional masking, deposition and etching operations performed on a silicon wafer during a semiconductor manufacturing process. For ease of reference and comparison with prior art IC 100, a series of top surface interconnect nodes 210 are depicted as well. Such top surface interconnect nodes 210 are located on a top surface of die 230, and are distributed according to desired signal connections with electronic circuits formed in (and on) die 230. Top surface interconnect nodes 210 are formed from such conventional conductive materials such as aluminum, gold, or some other suitable low resistance material.

In a preferred embodiment, top surface interconnect nodes 210 are preferably much smaller than comparable I/O bonding pads of prior art IC 100. In fact, top surface interconnect nodes 210 need only be large enough to be able to carry sufficient current associated with I/O signals generated by device 200 to external devices. Typically, therefore, such nodes can have an area corresponding to approximately 4 mils by 4 mils in size. The reason for this is to ensure that a maximum amount of top surface area of die 230 is then usable instead for fabricating other electronic circuits. Compared to a conventional package as seen in FIG. 1, where approximately 10% of the processing area is wasted to I/O bonding pads, the present invention can reduce such area by ½, to 5% or less of the total area, depending on the number of interconnects needed.

By avoiding the need for I/O pads on the top of die 230, a wafer manufactured in this way will have increased circuit density, reliability, yield and throughput. Of course, nodes 210 can also be made to be as large as conventional I/O bonding pads, and in some environment it may be desirable to have some portion of the I/O signals accessible in this manner to other interonnects coupled to the top surface of die 230. In general, however, one of the primary goals and benefits of the present invention is the ability to reduce the amount of usable die circuit wafer processing area needed to establish I/O interconnects (including power and ground) to external circuits. Accordingly, a preferred embodiment of the present invention minimizes the die top surface area taken up by top surface interconnect nodes 210. While the number of top surface interconnect nodes 210 shown in FIG. 2A is depicted to be the same as the number of I/O pads 110 in FIG. 1, it should be apparent that the number of top surface interconnect nodes 210 can be different, and, in fact much larger in some cases. For example, it may be desirable to have more than one of such nodes for carrying a power and/or ground signal to circuits within die 230. They can also be laid out, of course, in any desired pattern. Moreover, while top surface interconnect nodes 210 are all shown to be the same size, they can of course be varied in shape and physical area to achieve the particular needs of the signal being carried at such node.

Figure 2B:
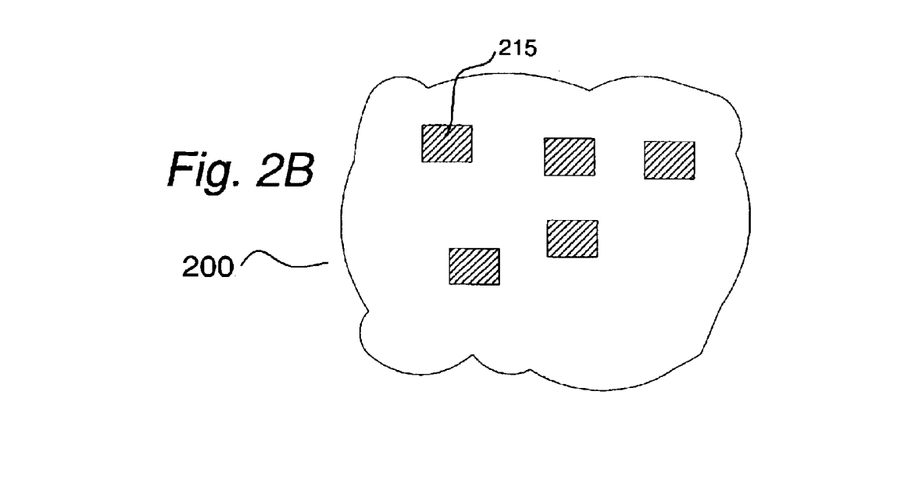

Conversely, a partial view of a bottom surface of die 230 is depicted in FIG. 2B. These bottom surface interconnect nodes 215 are preferably larger than top surface interconnect nodes 210. Typically such bottom surface interconnect nodes 215 occupy an area approximately 8 mils by 8 mils in size. Generally speaking these nodes are larger because they serve as primary interconnects for I/O signals from device 200, and therefore should be sized so as to minimize contact resistance with a corresponding mating surface from a second device 200' (not shown). Nonetheless, since the entire bottom surface of die 230 is available for inter-chip interconnects using the present invention, a larger number of interconnects can be accommodated than that available with the prior art scheme shown in FIG. 1. This characteristic leads to a number of additional benefits, including the fact that a greater number of external power and ground supply signals can be provided to more circuit areas on the top surface of die 230. This results in better power performance, including better heat dissipation, less signal attenuation, less susceptibility to noise problems, etc. Other advantages will be apparent to those skilled in the art.

Figure 2C:
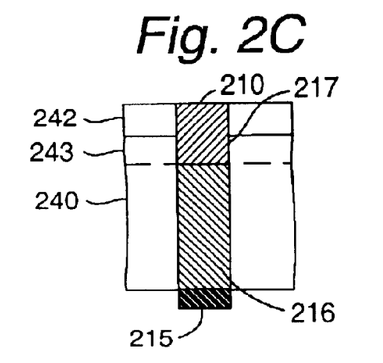

A cross-sectional view of one embodiment of die 230 is illustrated in FIG. 2C. This structure has certain manufacturing advantages that may make it attractive for applications described further below. In particular, such structure can be used as part of a simple, cost-effective and flexible packaging arrangement which can be implemented in its entirety even before a wafer undergoes any normal processing operations.

A die through-hole interconnect 204 is formed in a via 205 in die 230. The top portion extends from a top surface of die 230 (above layer 242) to a desired depth corresponding to a distance represented by layer 243. The top portion of via 205 is filled with a sandwich of materials, including top surface interconnect node 210, and a second conductive layer 216. The bottom portion of via 205 is similarly filled with a third conductive layer 217, which may be comprised of a material which is the same as that for conductive layer 216.

In a preferred embodiment, material choices for conductive layers 216 and 217 depend on a processing cycle used to make die through-hole interconnect 204. For example, if die through-hole interconnect 204 is made before other active circuits are processed within die 230, then it must include materials that are compatible with such later active circuit processing steps. These may include, for example, conventional refractory metals including Ti, W, WTsi, alloys of the same, and other conductors—such as doped polysilicon—that are compatible with such later processing operations. If instead die through-hole interconnect 204 is completed after initial devices are first formed in die 230, it can be constituted instead from a different set of conductive materials, including for example, lower temperature compatible metals such as Al, Gold, Cu, alloys containing the same, etc. It should be appreciated, of course, that these materials are merely examples and that the final selection of materials for any particular IC can be selected by a skilled process engineer based on conventional manufacturing process guidelines.

Capping off the bottom of die through-hole interconnect 204 is a bottom surface interconnect node 215. This node is made of suitable contact materials, including Al, Gold, Cu, and alloys containing the same. As is also well-known in the art, bottom surface interconnect node 215 can further include a conductive contact "bump" added through conventional techniques. Such bump can be made of Pb-Sn, or similar materials, and serves to create a better interconnect contact with a mating surface of an I/O structure of a second device. A description of a conventional bumping method is provided in the aforementioned U.S. Pat. No. 5,424,245 incorporated by reference herein.

As referred to above, die through-hole interconnect 204 extends from a die circuit interconnect layer 242 to a bottom portion of an active layer 243. While shown in simplified form, it is understood that interconnect layer 242 may include a number of separate metallization and associated isolation layers formed during conventional IC processing operations. Active layer 243 is illustrated to include a plurality of active areas 244 which are used for forming electronic circuits within die 230. Again, such electronic circuits are formed in such areas using conventional masking, deposition, etching and doping operations. As mentioned above, top surface interconnect node 210 is connected to receive various I/O signals from such electronic circuits. This node can be fabricated either as part of interconnect layer 242, or in a different operation as described in more detail below.

Figure 2D:
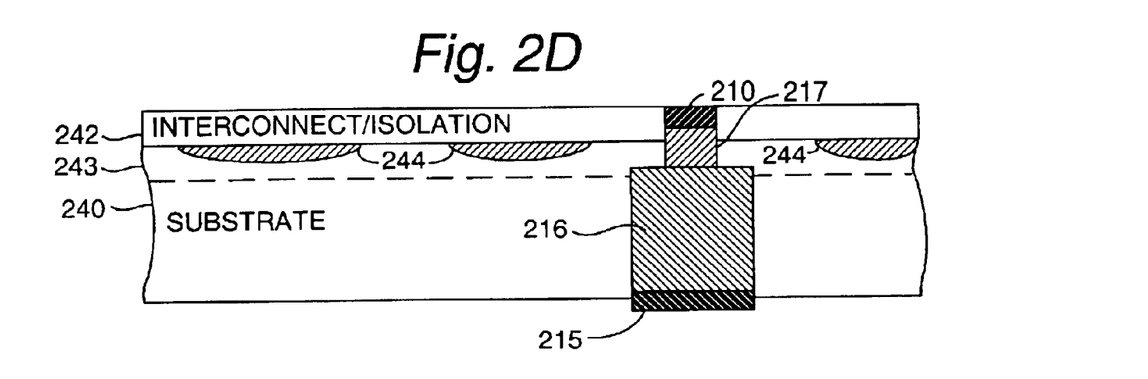

A cross-sectional view of a second embodiment of die 230 is illustrated in FIG. 2D. For ease of reference, like numerals refer to like structures from FIG. 2C above. The major difference in this case is of course the shape of via 205, which, in this case, is appropriately shaped to include differently sized top and bottom portions.

Figure 2E:
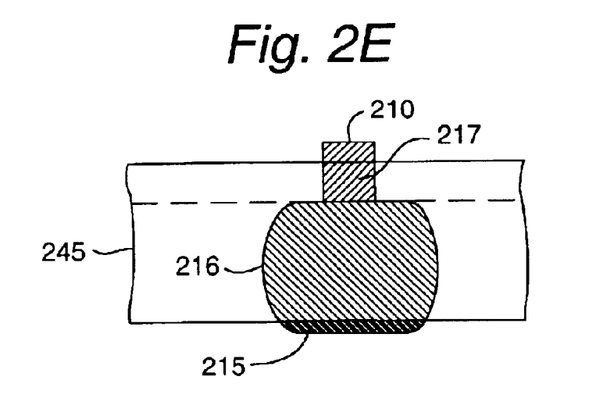

A third embodiment of an IC of the present invention is illustrated in FIG. 2E. The primary difference to the first embodiment is the fact that the bottom portion of via 205 is formed to be conical or hemispherically shaped. This structure has operational benefits and processing simplicities that may make it attractive for certain applications.

Other variations of shapes for via 205 will become apparent to those skilled in the art from the present disclosure, and the present invention is by no means limited to any particular implementation.

Figure 3A:
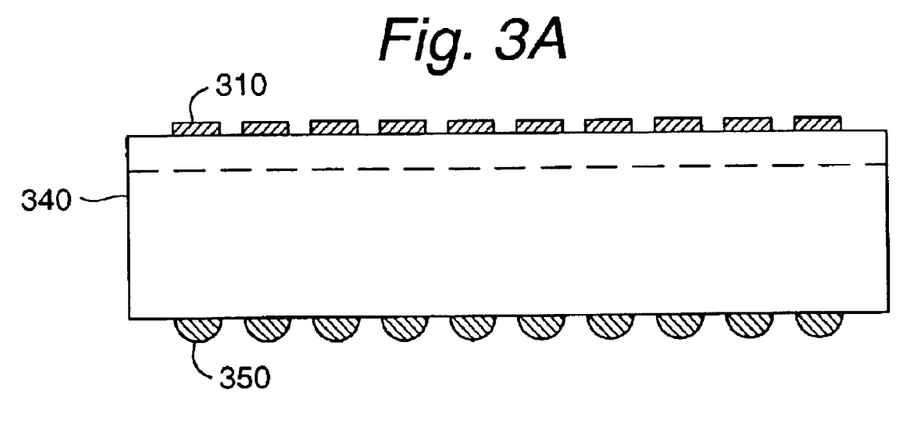
FIG. 3A is a side view of another embodiment in which solder bump contacts have been added to the backside of the chip package so as to facilitate interconnect with other chips.
Figure 3B:
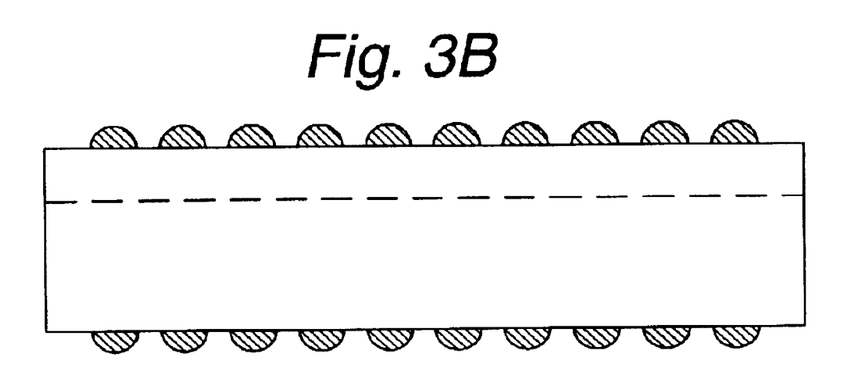
FIG. 3B is a side view of another embodiment in which solder bump contacts have been added to both the topside and backside of the chip package so as to facilitate interconnect with other chips.
Figure 3C:
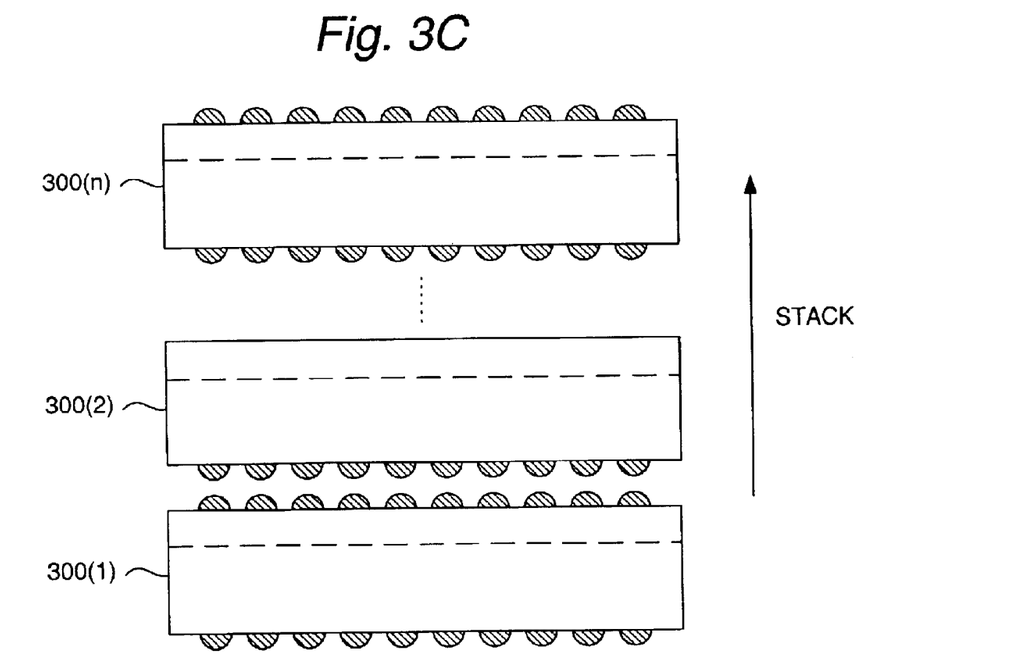
FIG. 3C is a side view of a preferred embodiment of an electronic circuit formed from one or more of the chip packages of the present invention, in which solder bumps contacts on the backside of the chip package interconnect with solder bump contacts on the topside of other chips.
Figure 3D:
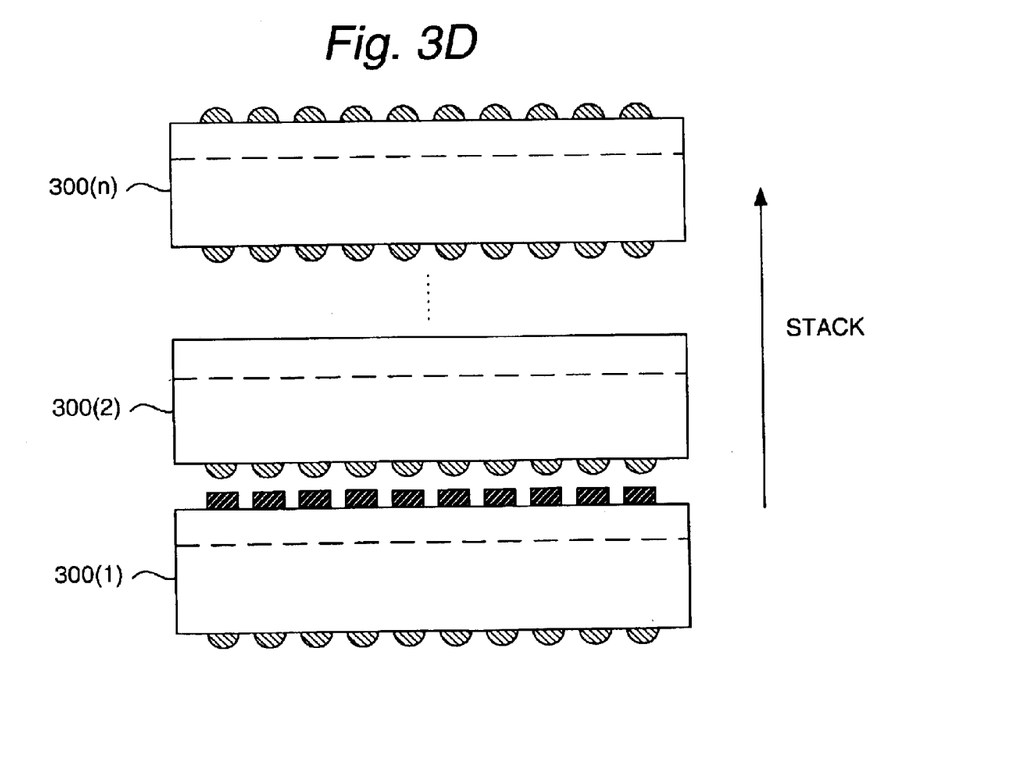
FIG. 3D is a side view of a preferred embodiment of an electronic circuit formed from one or more of the chip packages of the present invention, in which solder bumps contacts on the backside of the chip package interconnect with flat bonding pad contacts on the topside of other chips.

Examples of highly integrated electronic circuits formed in accordance with the present invention is illustrated in FIGS. 3A to 3D. In FIG. 3A, an embodiment of an IC in which both top side interconnects 310 and bottom side interconnects 350 is depicted. As mentioned earlier, such interconnects can include traditional bonding pads, bumps, tape automated bonding, and other conventional structures. A further embodiment shown in FIG. 3B includes bumps for interconnects on both sides of die 230. Again, as described earlier, such top-side interconnects may be omitted in some cases to increase circuit integration density on the top side of die 230. FIG. 3C illustrates a multi-chip electronic circuit formed from N (where N>=2) ICs of the type described herein. In this embodiment, top surface interconnects for device 300(1) are implemented in bump form, and are mated to bottom surface interconnects for device 300(2), and so on, for each device in the stack. An alternative embodiment in FIG. 3D includes top surface interconnects that are of the typical bond pad variety instead of the bumped variety shown in FIG. 3C. Methods for interconnecting two devices 300(1) and 300(2) in die form are well-known in the art, and may include traditional reflow techniques of the type described in pp. 391–395 of *Hanneman* for joining bonding pads to bumps, bumps to bumps, etc. The resulting stack is a highly dense electronic circuit, and is advantageously used for creating large DRAM structures. DRAMS are commonly manufactured in 1 bit by N varieties, and then assembled into multi-chip modules. Using the present invention, therefore, a stack of 8 identical 1 bit by 16 M DRAMs, can be assembled and interconnected appropriately together to form a 16 M byte DRAM module. Other useful applications for the present invention will be apparent to those skilled in the art.

Figure 4A:
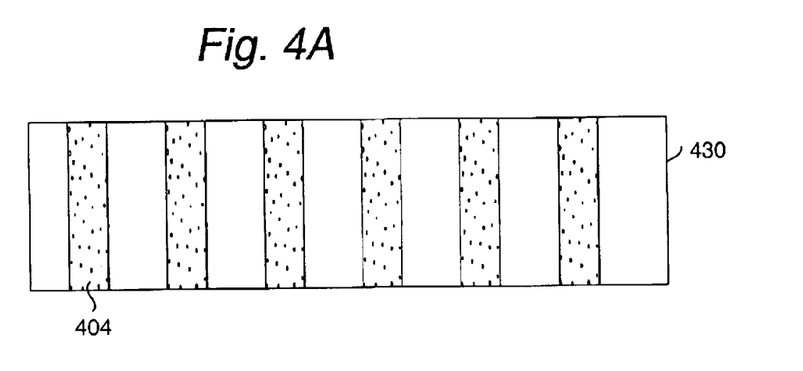
FIGS. 4A to 4D depict a process of making the chip and packaging illustrated in FIGS. 2A–2D.

A process for forming the IC and package of the present invention is illustrated in FIGS. 4A to 4F. Unless otherwise indicated, like numeric designations in the drawings and following description are intended to correspond to like identifications provided above in connection with FIGS. 2 and 3. In a preferred embodiment, as shown in FIG. 4A, small apertures or vias 404 (on the order of 4 mils in diameter) are formed in an unprocessed wafer. Again, to save time and expense, these operations preferably take place outside the normal high grade clean room environment. The formation of the packaging portion of the chip manufacturing is not nearly as challenging from a lithographic and etching perspective as that required for creating the silicon patterns required for the active circuits. Thus, since the vias are rather large (compared to the typical feature size which high end equipment must cope with), they can be placed and manufactured using relatively low cost equipment. In fact, to save cost, vias 404 can be mechanically drilled very rapidly across the entire surface of the wafer with conventional equipment.

Figure 4B:
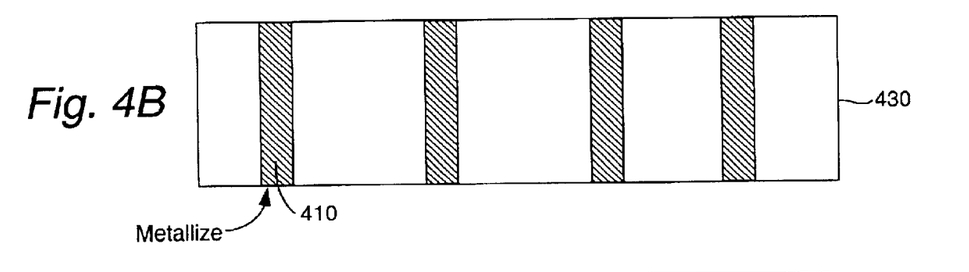
Figure 4C:
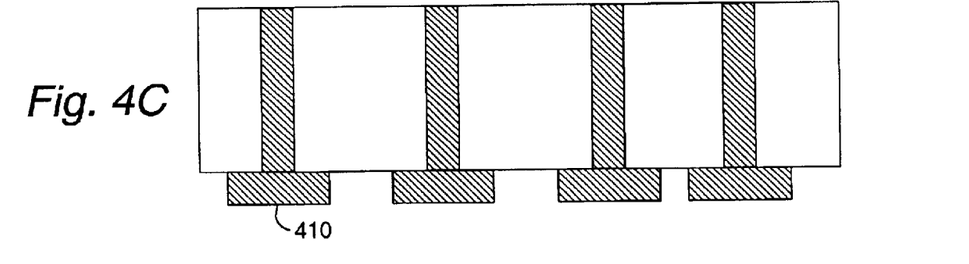
Figure 4D:
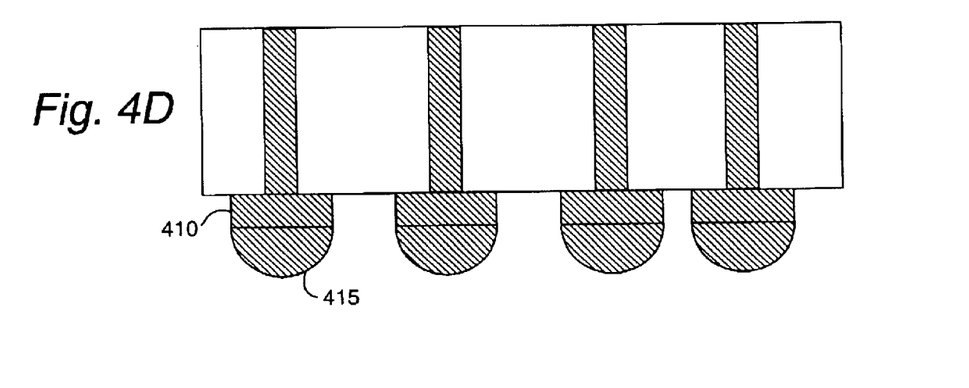

It is understood, of course, that die 430 may include additional layers formed thereon both before and after such aperture formation, including for example substrate insulating, passivation and adhesion layers. As shown in FIGS. 4B to 4D, the vias can be filled with a suitable metallization layer (as discussed above for FIG. 2C) and then pads and/or solder bumps can be added to complete the packaging operations for each die in the wafer. Notably, these metallization, pad, and bump operations preferably can take place in a lower cost manufacturing environment than the high resolution lithographic patterning and etching operations associated with the active circuitry of the wafer.

At this point, chip scale packaging operations have been essentially completed, because all that is necessary now is for the various active circuit layers, interconnect, and passivation layers to be formed on the surface of the wafer. The necessary connections to the conductive top portions of vias 404 can be accomplished as part of these later operations as well. By removing chip scale packaging operations from the fab environment, a steady supply of pre-drilled, pre-packaged die can be generated, even before any active circuit processing operations are performed. This means that throughput is higher at the fab site, since packaging operations are already substantially completed.

The aforementioned process for making chip scale packaging is also useful for a number of additional reasons. For example, customer orders for specific parts are also more easily planned, since after normal processing, the die are already in packaged form ready to be shipped after test. Control of the packaging varieties can be kept in-house, thus avoiding potential disruptions from packaging assemblers. When processing a lot of wafers, the packaging can be pre-specified by a customer in advance, so that the fab operators need only retrieve a wafer having the particular pre-formed packaging type before commencing normal processing operations. Thus delivery times can be expedited over normal processing/packaging type manufacturing set-ups.

Figure 4E:
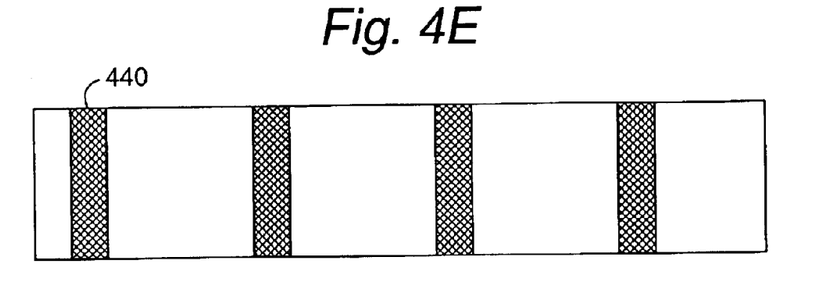
FIGS. 4E to 4K depict a variation of the process of FIGS. 4A to 4D.

As mentioned before, it is, of course, possible, to include some packaging operations at the fab facility and still preserve the advantages of the present invention. An embodiment of this aspect of the present invention is shown in FIGS. 4E to 4K. In FIG. 4E, the via holes have also already been pre-drilled (formed) at a low cost, off-fab site location. An additional optional step of filling such vias 404 with a dielectric layer, is illustrated, with a conventional material such as $SiO_2$. This additional "filler" can be any suitable material that can provide additional support for the wafer during subsequent processing steps, and may be required in some environments depending on the thickness of die 430, the size of vias 404, etc. The use of a dielectric filler at this stage of the process also avoids certain temperature restrictions inherent with the low temperature metallizations used in prior art processes. Again, this filler operation preferably can take place in a lower cost manufacturing environment than the high resolution lithographic patterning and etching operations associated with the active circuitry of the wafer.

Figure 4F:
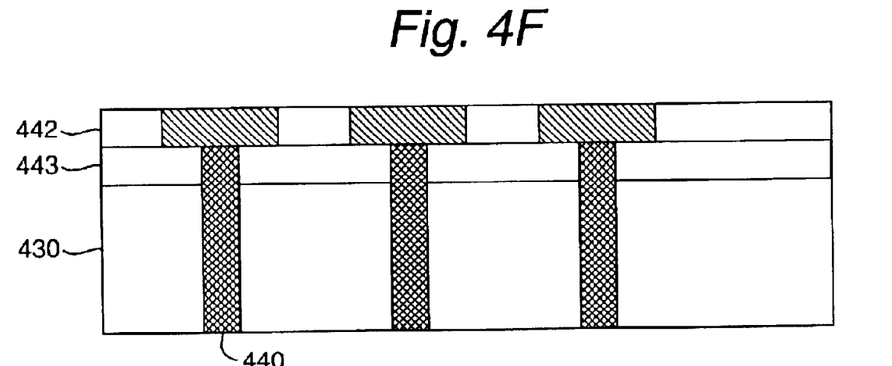
Figure 4G:
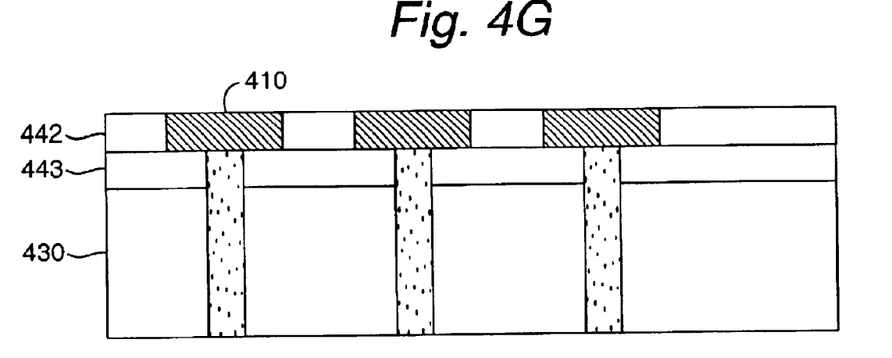
Figure 4H:
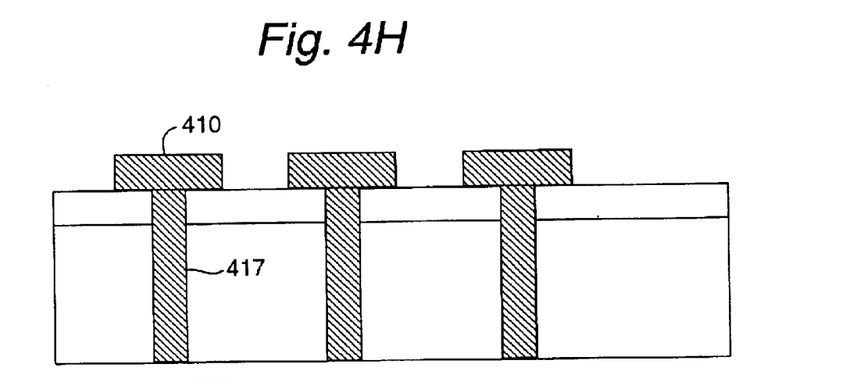
Figure 4I:
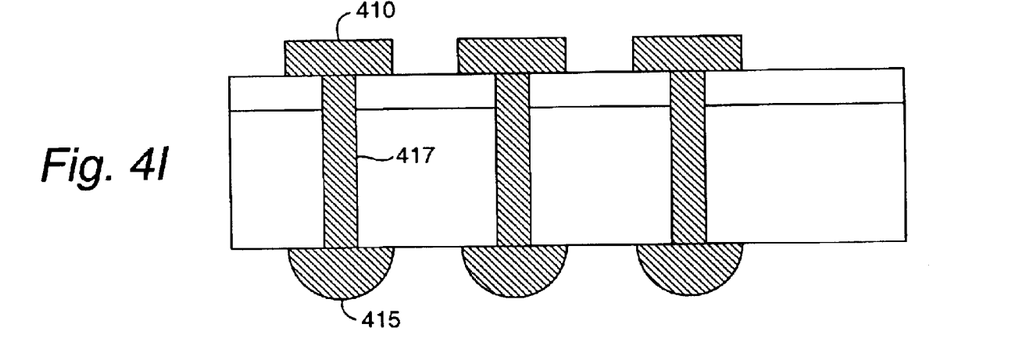
Figure 4J:
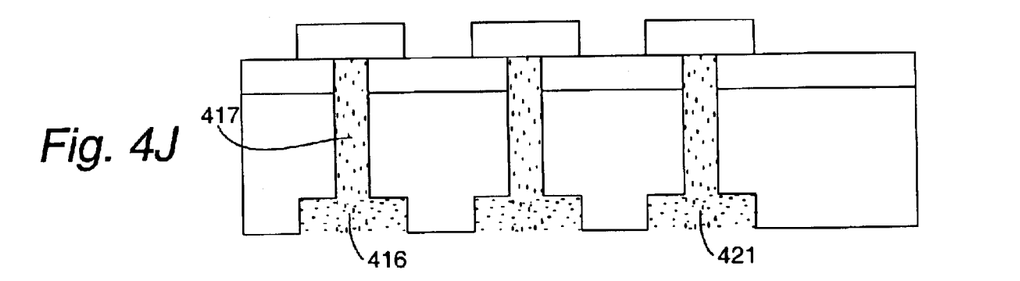

In any event, in a next step illustrated at FIG. 4F, conventional circuit manufacturing operations are performed to form active devices in areas 443, as well as interconnect layers 442 on substrate 440 of die 430. While this is shown as a single step for better illustrating the present invention, it will be appreciated of course that a number of separate manufacturing operations are required to form the resulting structure and electronic circuits within die 430 as shown in FIG. 4F. At the end of this sequence, a series of top surface interconnect nodes 410 are thus located as desired at a top portion of vias 404. Again, such top surface interconnect nodes 410 can vary in size depending on a desired application as noted above, but need only be large enough to carry I/O signals (including power, ground) as needed to electronic circuits on the top surface of die 430. In a subsequent step depicted in FIG. 4G, the dielectric material 420 is selectively etched out of vias 404; since top surface interconnect nodes 410 abut the top of such via 404, the material used for this layer can be used as an etch stop if desired. At a next step illustrated in FIG. 4H, the now empty vias 404 can be filled with a conductive material as noted above using conventional deposition techniques, including electroplating, evaporation, etc. The particular choice of techniques and materials must take into account the aspect ratio of via 404, compatibility with preexisting and subsequent layers on die 430, and other process factors well-known in the art. While vias 404 are shown filled completely with this conductive material, it may not be necessary in many cases to achieve such coverage. As seen in FIG. 4I, a final step completes the interconnect structure by adding a conductive bonding pad, or a conductive bump 415. This completes the essential details of the process of the present invention. Because they are not essential to an understanding of the present disclosure, other typical and well-known processing steps which may take place during (or before/after) the sequence illustrated in FIGS. 4E to 4I, including cleaning, masking, depositions, etc., are omitted.

Figure 4K:
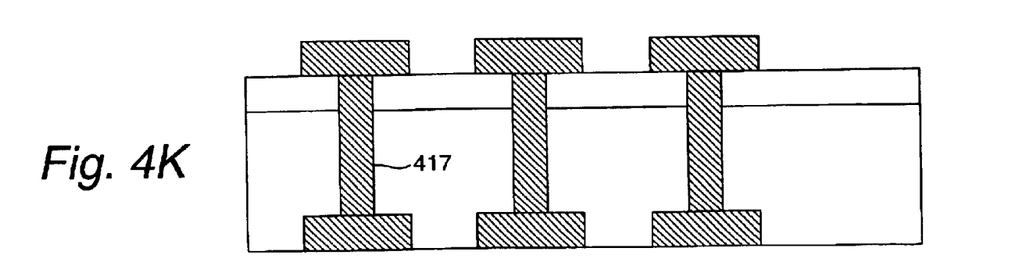

In an embodiment where it is desirable to have a bottom portion of via 404 which is much larger than a top portion, the additional step 4J can be performed (in lieu of step 4H) after step 4G. In this step, the bottom surface of die 430, and top portion 417 of via 404 are masked using conventional techniques so that the only exposed substrate portions are within a bottom portion 416 of via 404. An etching operation is then used to attack the bottom sidewalls of via 404, expanding it to look as seen in FIG. 4K. Masking and etching procedures for achieving this type of essentially two-stepped vertical sidewall via structure, as well as the via structure shown in FIG. 2D are well-known in the art. Other shapes will be apparent to those skilled in the art. Thereafter, die 430 is processed in the same manner as set forth in FIG. 4E, to arrive at the final structure shown in FIG. 4K.

Other variations for making an IC of the type described herein will be apparent to those skilled in the art. For example, a "backlapping" approach could be used for making the vias, where the vias 404 are initially-not opened all the way to the bottom of die 430 during an initial drilling step. A later grinding step is used to remove material from the backside of the wafer, until sufficient material is taken away to open up the other end of the vias. An example of this technique can be seen in U.S. Pat. No. 5,424,245. Furthermore, while the preferred embodiment has the vias formed prior to normal processing operations for making active device, it is apparent that they can be formed after such operations as well. The benefits of the present invention are not limited to any particular sequence in this respect.

Figure 5A:
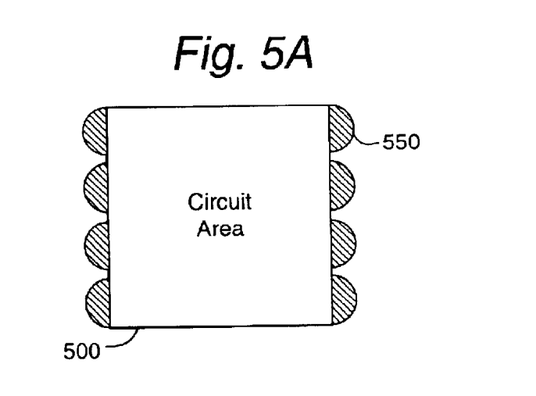
FIGS. 5A–5B are top and side views of an embodiment of another variation of the present invention, wherein solder bump contacts are formed on the side of a die.
Figure 5B:
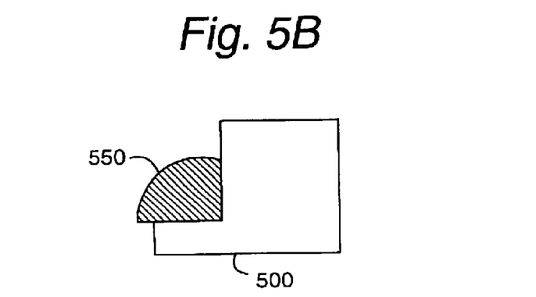
Figure 5C:
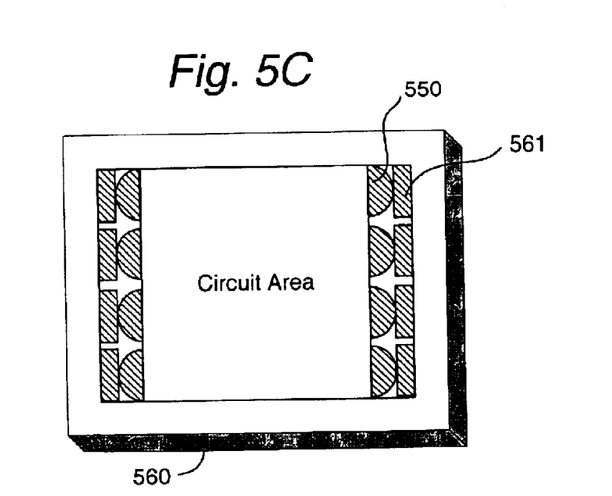
FIGS. 5C and 5D are top and side views of a chip mating receptacle suitable for use with the integrated circuit of the type depicted in FIGS. 5A and 5B.
Figure 5D:
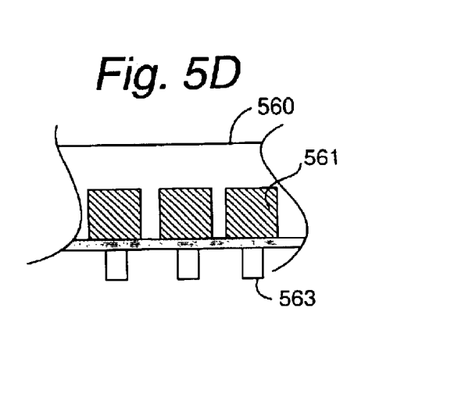

Another illustrative embodiment of the present invention is depicted in FIGs. 5A (top view) and 5B (side view). In this variation, a die 500 can include active circuits on a surface area 520, and interconnect to other die through solder bumps 550 formed on the side of the die. An example of a manufacturing process of creating such a structure is given in detail in U.S. Pat. No. 5,682,062 in connection with FIGS. 10A–10M discussed therein (columns 13–15), and this description is hereby incorporated by reference. Generally speaking, however, in the present embodiment, solder bumps 550 are preferably formed from a material that has a low contact resistance, because it is intended to be used with a mating receptacle 560 as shown in FIG. 5C. Accordingly, since this material is not intended to be reflowed, or soldered, it can be formed of any convenient substance, including, for example gold, nickel, or even Tin, Tin/lead and other low cost alloys. As shown in FIG. 5C, this mating receptacle 560 includes a recessed area large enough to receive the body of die 500 in a frictional contact fit. This frictional fit arises as a result of solder bumps 550 contacting opposing mating surface 551, the latter which is preferably a low resistance contact pad made of a substance such as gold, or particle enhanced interconnect material. As seen in FIG. 5D, these mating pads then carry the various I/O signals from circuit area 520 through pins 563 to other circuits which may be located, for example, on a printed circuit board. It is apparent, of course, that the arrangement of solder bumps 550 and mating surface 551 can be reversed—i.e., that die 500 can use pads, and that mating surface 551 can be formed as a bump—to achieve the same result. The benefit of the present arrangement can be seen in the fact that this form of interconnect is extremely easy to assemble (and thus cost effective) because it can be accomplished by simply applying a small amount of mechanical force applied to the die 500 so that it snaps into place within mating receptacle 560. In this way, conventional soldering, reflow, or adhesive type mating arrangements of the type shown in U.S. Pat. No. 5,682,062 are eliminated, but yet the advantages of a highly integrated die (i.e., with no wasted active area for contact pads) can be preserved. The solder bumps and mating contacts can be made of relatively inexpensive materials as well, since they only need to form a single contact (usually) during the lifetime of the device. In other words, it is expected that the die itself may have to replaced at most a couple of times, so there is no need to make the contact surfaces extremely durable, as would be the case for a part that would require many insertions and removals.

Some of the benefits of the present invention include:

1) The interconnect is shorter than conventional leadframe or TAB structures, and this results in faster speed, less signal decay, and higher S/N ratios;

2) The yield of a packaged IC containing die manufactured as noted above will be higher, since the interconnect does not rely on wire-bond type structures, which are susceptible to a number of manufacturing limitations, and are easily broken because they are fragile;

3) Because of superior transmission line physical characteristics, the signal path using the above interconnect can handle higher I/O signal frequencies than conventional lead frame structures;

4) The number, arrangement and shape of the through-hole vias can be selected and optimized for any desired die/interconnect requirement;

5) Since the interconnects can be distributed as desired by a circuit and layout designer, power and ground connections can be routed to any desired area within an electronic circuit, unlike conventional packages where there is typically only one such connection, and this signal must be routed across the die to the appropriate areas. This takes up additional routing space on the die, again reducing integration density of the circuits thereon.

6) Because the signal path is shorter, the present invention provides better noise immunity from spurious electronic interferences;

7) Since the chip packaging can be performed in part, or even entirely, in an offsite, inexpensive front end facility, overall costs can be reduced, and cycle times improved for overall wafer processing.

Although the present invention has been described in terms of a preferred embodiment, it will be apparent to those skilled in the art that many alterations and modifications may be made to such embodiments without departing from the teachings of the present invention. Accordingly, it is intended that the all such alterations and modifications be included within the scope and spirit of the invention as defined by the following claims.

What is claimed is:

1. A semiconductor device, comprising:

a semiconductor die; and an electronic circuit located on a top surface of said die; and a first interconnect structure also located on said top surface of said die, said first interconnect structure being coupled to said electronic circuit and being characterized by first nodes having a first feature size;

a second interconnect structure located on a bottom surface of said die, said second interconnect structure being characterized by second nodes having a second feature size, said second feature size being at least twice that of said first feature size;

said first interconnect structure and said second interconnect structure being coupled through conductive lines located in a plurality of vias extending from said top surface through said die to said bottom surface;

wherein said second nodes are physically distributed in a contact area of said bottom surface which overlaps with portions of said electronic circuit on said top surface, so that said contact area is not exclusively in edge areas of said semiconductor die surrounding said electronic circuit.

2. The device of claim 1, wherein said device is contained within a single semiconductor wafer including a plurality of die for a plurality of additional identical devices, and wherein a top surface of said wafer includes only such plurality of additional identical devices and a corresponding plurality of first interconnect structures.

3. The device of claim 1, wherein said vias are filled with a conductive material capable of withstanding a high temperature cycle associated with a manufacturing operation used for said electronic circuit.

4. The device of clam 1, wherein said plurality of vias have a top portion and a bottom portion that are different in size.

5. The device of claim 1, wherein said second interconnect structure includes conductive pads.

6. The device of claim 1, wherein said second interconnect structure includes a conductive bump structure.

7. The device of claim 1, wherein contact pad structures located on a top surface of said die occupy less than 5% of a total area of said top surface.

8. The device of claim 1, wherein contact area is substantially larger than a top surface contact area for the semiconductor die located on a top surface of said semiconductor die.

9. The device of claim 8, wherein contact area is distributed across all of said bottom surface of said semiconductor die.

10. A multi-chip electronic circuit, comprising:

a first and second semiconductor die; and a first electronic circuit being located on said first die; and a second electronic circuit being located on said second die; and said first semiconductor die including a first via, which first via has a first via top portion beginning at a first top surface of said first die and extending through said first die to a first via bottom portion on a first bottom surface of said first die;

a first input/output (I/O) interconnect physically and electrically coupled to said first via bottom portion, said first I/O interconnect structure being located within a first area on the first bottom surface of said first die and further being arranged so as to comprise a portion of a chip scale package integrated with said first semiconductor die; and a first I/O signal line coupled to said first electronic circuit and said first I/O interconnect structure by passing through said first via;

a second input/output (I/O) interconnect electrically coupled to said second electronic circuit, and further being physically and electrically coupled to said first I/O interconnect;

wherein said second (I/O) interconnect is physically distributed in a contact area of said first bottom surface which overlaps with portions of said first electronic circuit on said first top surface, so that said contact area is not exclusively in edge areas of said first semiconductor die surrounding said first electronic circuit;

wherein electrical signals can be communicated between said first and second electronic circuits through said first and second I/O interconnects;

further wherein at least said first semiconductor die includes an additional I/O interconnect on a top surface characterized by an interconnect structure that is substantially smaller than that of said first I/O structure.

11. The circuit of claim 10, further wherein:

said first I/O interconnect includes a first conductive bump structure as part of said chip scale package;

said second I/O includes a second conductive bump structure comprising a portion of a second chip scale package integrated with said second semiconductor die; and further wherein said first and second conductive bumps are joined together to effectuate an electronic signal path.

12. The circuit of claim 10, further wherein:

said first I/O interconnect includes a conductive bump as part of said chip scale package;

said second I/O interconnect includes a bond pad; and further wherein said conductive bump and bond pad are joined together to effectuate an electronic signal path.

13. The circuit of claim 10, further wherein said second semiconductor die includes a second via, which second via has a second via top portion beginning at a second top surface of said second die and extending through said second die to a second via bottom portion on a second bottom surface of said second die; and said second input/output (I/O) interconnect is electrically coupled to said second via top portion.

14. The circuit of claim 13, further wherein said second semiconductor die includes a third I/O interconnect, which third I/O interconnect is located on said second bottom surface of said second die and is coupled to said second via bottom portion so as to comprise a portion of a second chip scale package integrated with said second semiconductor die.

15. The circuit of claim 14, further including:

a third semiconductor die; and a third electronic circuit being located on said third die; and a fourth input/output (I/O) interconnect electrically coupled to said third electronic circuit, and further being physically and electrically coupled to said third I/O interconnect;

wherein electrical signals can be communicated between said second and third electronic circuits through said third and fourth I/O interconnects.

16. A semiconductor device, comprising:

a semiconductor die, said die having a top surface, a bottom surface, and a plurality of side surfaces which are perpendicular to said top surface and/or said bottom surface; and an electronic circuit located on top surface of said die; and a plurality of input/output (I/O) interconnects physically located on one or more of said plurality of side surfaces including along at least one edge of said die;

a plurality of I/O signal lines, each of said I/O signal lines being coupled to one or more of said plurality of said I/O interconnects;

wherein said I/O interconnects are configured so that they are capable of forming a frictional contact fit along said at least one edge of said die with corresponding mating interconnects coupled to a second electronic circuit which is not formed as part of said semiconductor die.

17. The device of claim 16, further including a semiconductor device mating receptacle, which mating receptacle includes a plurality of mating interconnects adapted to form a frictional contact with corresponding ones of said plurality of I/O interconnects.

18. The device of claim 17, wherein said mating receptacle includes a plurality of contact leads coupled to said plurality of mating interconnects for carrying signals from said electronic circuit to said second electronic circuit.

* * * * *